United States Patent
Kim et al.

(10) Patent No.: US 8,803,266 B2
(45) Date of Patent: Aug. 12, 2014

(54) STORAGE NODES, MAGNETIC MEMORY DEVICES, AND METHODS OF MANUFACTURING THE SAME

(75) Inventors: Kwang-seok Kim, Seongnam-si (KR); U-In Chung, Seoul (KR); Jai-kwang Shin, Anyang-si (KR); Kee-won Kim, Suwon-si (KR); Sung-chul Lee, Osan-si (KR); Ung-hwan Pi, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 148 days.

(21) Appl. No.: 13/313,361

(22) Filed: Dec. 7, 2011

(65) Prior Publication Data

US 2012/0139069 A1  Jun. 7, 2012

(30) Foreign Application Priority Data

Dec. 7, 2010  (KR) .................... 10-2010-0124440
Oct. 19, 2011  (KR) .................... 10-2011-0107058

(51) Int. Cl.
*H01L 29/72* (2006.01)
(52) U.S. Cl.
USPC ............. 257/421; 257/E29.323; 257/E21.04; 438/3; 360/319; 365/173
(58) Field of Classification Search
USPC ................. 257/421, E21.04, E29.323; 438/3; 360/319; 365/173
See application file for complete search history.

(56) References Cited

U.S. PATENT DOCUMENTS

| 6,430,085 | B1 | 8/2002 | Rizzo |
| 6,765,250 | B2 | 7/2004 | Doan et al. |
| 6,765,823 | B1 | 7/2004 | Zhu et al. |
| 6,906,950 | B2 | 6/2005 | Zhu et al. |
| 7,208,323 | B2 | 4/2007 | Zhu et al. |
| 7,821,088 | B2 | 10/2010 | Nguyen et al. |
| 2003/0215961 | A1 | 11/2003 | Doan et al. |
| 2005/0226040 | A1 | 10/2005 | Zhu et al. |
| 2008/0230819 | A1 | 9/2008 | Nguyen et al. |
| 2010/0177447 | A1* | 7/2010 | Yanagisawa ............ 360/319 |

FOREIGN PATENT DOCUMENTS

| JP | 2003-209226 A | 7/2003 |
| JP | 2003-209227 A | 7/2003 |
| KR | 2010-0004296 A | 1/2010 |
| KR | 2010-0047985 A | 5/2010 |

* cited by examiner

*Primary Examiner* — Edward Wojciechowicz
(74) *Attorney, Agent, or Firm* — Harness, Dickey & Pierce, P.L.C.

(57) ABSTRACT

A storage node of a magnetic memory device includes: a lower magnetic layer, a tunnel barrier layer formed on the lower magnetic layer, and a free magnetic layer formed on the tunnel barrier. The free magnetic layer has a magnetization direction that is switchable in response to a spin current. The free magnetic layer has a cap structure surrounding at least one material layer on which the free magnetic layer is formed.

13 Claims, 16 Drawing Sheets

US 8,803,266 B2

STORAGE NODES, MAGNETIC MEMORY DEVICES, AND METHODS OF MANUFACTURING THE SAME

CROSS-REFERENCE TO RELATED APPLICATIONS

This application claims priority under 35 U.S.C. §119 to Korean Patent Application No. 10-2010-0124440, filed on Dec. 7, 2010, in the Korean Intellectual Property Office, and Korean Patent Application No. 10-2011-0107058, filed on Oct. 19, 2011, in the Korean Intellectual Property Office, the disclosures of which are incorporated herein in their entirety by reference.

BACKGROUND

1. Field

Example embodiments relate to memory devices, for example, storage nodes including a free magnetic layer of a magnetic anisotropy material, magnetic memory devices including storage nodes, and/or methods of manufacturing storage nodes and magnetic memory devices including storage nodes.

2. Description of the Related Art

In the field of magnetic tunnel junctions (MTJs), a magnetic random access memory (MRAM) having a tunneling magnetoresistance (TMR) effect has been researched as a next generation non-volatile memory device due to its non-volatility, relatively high-speed operation, and relatively high endurance.

An initial magnetic memory device used a method of switching an MTJ by using an external magnetic field. In this case, a separate wiring in which current flows was required to generate an external magnetic field. Considering the relatively high integration of memory devices, requiring a separate wiring for generating an external magnetic field may hinder increased integration of magnetic memory devices.

In the case of a spin transfer torque MRAM (STT-MRAM) for storing information by spin transfer torque of a spin current, an MTJ cell is switched according to a spin state of a current passing through the MTJ cell. Accordingly, a lead wire is not needed to generate an external magnetic field, unlike a conventional magnetic memory device. Thus, STT-MRAM is a magnetic memory device that may achieve higher levels of integration.

SUMMARY

At least some example embodiments provide storage nodes capable of increasing integration of magnetic memory devices, and realizing a volatile or non-volatile magnetic memory device.

At least some example embodiments also provide magnetic memory devices including storage nodes.

At least some example embodiments also provide methods of manufacturing storage nodes and methods of manufacturing magnetic memory devices including storage nodes.

At least one example embodiment provides a storage node of a magnetic memory device. According to at least this example embodiment, the storage node includes: a lower magnetic layer; a tunnel barrier layer formed on the lower magnetic layer; and a free magnetic layer formed on the tunnel barrier layer and in which a magnetization direction is switched by a spin current; wherein the free magnetic layer has a cap surrounding at least one of material layers that are formed under the free magnetic layer.

At least one other example embodiment provides a storage node of a magnetic memory device. According to at least this example embodiment, the storage node includes: a lower magnetic layer; a tunnel barrier layer formed on the lower magnetic layer; and a free magnetic layer formed on the tunnel barrier layer. The free magnetic layer has a magnetization direction that is switchable in response to a spin current. The free magnetic layer also has a cap structure surrounding at least one material layer on which the free magnetic layer is formed.

According to at least some example embodiments, the tunnel barrier may have a cap structure surrounding the at least one material layer.

The free magnetic layer may be formed of an in-plane magnetic anisotropy material or a perpendicular magnetic anisotropy material.

A spacer insulation layer may be provided between the free magnetic layer and a side surface of the at least one material layer.

The tunnel barrier layer may be provided on only an upper surface of the lower magnetic layer.

The lower magnetic layer may further include a pinning layer and a pinned layer that are sequentially deposited on one another.

The tunnel barrier layer may be provided on only an upper surface of the pinned layer.

When the free magnetic layer includes a perpendicular magnetic anisotropy material, the planar shape of the free magnetic layer may be circular or substantially circular, an aspect ratio may be 1, and/or a diameter thereof may be about 19 nm or about 26 nm.

When the free magnetic layer includes an in-plane magnetic anisotropy material, an aspect ratio of the free magnetic layer may be greater than or equal to about 2, and/or an area of a cell layout may be about 10 nm×15 nm.

When there is no external influence, the free magnetic layer may be a non-volatile material layer in which a determined magnetization direction is kept constant, or a volatile material layer that requires refresh for each determined cycle to maintain a determined magnetization direction.

A spacer insulation layer may be provided between the tunnel barrier layer and side surfaces of material layers formed under the tunnel barrier layer.

The side surface of the spacer insulation layer may be formed at an inclination angle of between about 70° and about 90°, inclusive.

The refresh rate may be longer than a refresh rate of a dynamic random access memory (DRAM), for example, less than or equal to 1 second or greater than or equal to 1 second.

At least one other example embodiment provides a magnetic memory device including: a switching device and a storage node connected to the switching device. According to at least this example embodiment, the storage node includes: a lower magnetic layer; a tunnel barrier layer formed on the lower magnetic layer; and a free magnetic layer formed on the tunnel barrier layer. The free magnetic layer has a magnetization direction that is switchable in response to a spin current. The free magnetic layer also has a cap structure surrounding at least one material layer on which the free magnetic layer is formed.

At least one other example embodiment provides a method of manufacturing a storage node of a magnetic memory device. According to at least this example embodiment, the method includes: forming a magnetic stack on a portion of a substrate, the magnetic stack including a lower magnetic layer and a tunnel barrier layer; forming a spacer insulation layer covering a side surface of the magnetic stack and having an inclined side surface; and forming a free magnetic layer covering an upper surface of the magnetic stack and extending over the inclined side surface of the spacer insulation layer.

According to at least some example embodiments, the magnetic stack may be formed by sequentially depositing the lower magnetic layer and the tunnel barrier layer, and then patterning the deposited layers in the reverse order.

A second tunnel barrier layer may be formed on the free magnetic layer.

The lower magnetic layer may further include a pinning layer and a pinned layer having a fixed magnetization direction.

The forming of a spacer insulation layer may include: forming an insulation layer on the substrate to cover the magnetic stack; and performing anisotropy etching on a surface (e.g., an entire surface) of the insulation layer to expose the substrate.

The side surface of the spacer insulation layer may be formed at an inclination angle of between about 70° and about 90°, inclusive.

The free magnetic layer may be formed of an in-plane magnetic anisotropy material or a perpendicular magnetic anisotropy material.

When the free magnetic layer includes an in-plane magnetic anisotropy material, an aspect ratio of the free magnetic layer may be greater than or equal to about 2 after forming the free magnetic layer.

The free magnetic layer may be formed according to a chemical vapor deposition (CVD) method, an atomic layer deposition (ALD) method, or a physical vapor deposition (PVD) method.

At least one other example embodiment provides a method of manufacturing a storage node of a magnetic memory device. According to at least this example embodiment, the method includes: forming a magnetic stack on a portion of a substrate, the magnetic stack including a lower magnetic layer; forming a spacer insulation layer covering a side surface of the magnetic stack and having an inclined side surface; and sequentially forming a tunnel barrier layer and a free magnetic layer covering an upper surface of the magnetic stack, and extending over the inclined side surface of the spacer insulation layer.

According to at least this example embodiment, the lower magnetic layer may be formed by sequentially depositing a pinning layer and a pinned layer having a fixed magnetization direction, and patterning the deposited layers in the reverse order.

The forming of a spacer insulation layer may include: forming an insulation layer on the substrate to cover the magnetic stack, and performing anisotropy etching on a surface (e.g., an entire surface) of the insulation layer to expose the substrate.

The inclined side surface of the spacer insulation layer may be formed at an inclination angle of between about 70° and about 90°, inclusive.

The free magnetic layer may be formed of an in-plane magnetic anisotropy material or a perpendicular magnetic anisotropy material.

When the free magnetic layer includes an in-plane magnetic anisotropy material, the free magnetic layer may be patterned to have an aspect ratio of greater than or equal to about 2, after the tunnel barrier and the free magnetic layer are sequentially formed.

At least one other example embodiment provides a method of manufacturing a magnetic memory device. According to at least this example embodiment, the method includes: forming a switching device on a substrate; forming an interlayer insulation layer on the substrate to cover the switching device; and forming a storage node connected to the switching device on the interlayer insulation layer. The storage node may be formed by: forming a magnetic stack on a portion of a substrate, the magnetic stack including a lower magnetic layer and a tunnel barrier layer; forming a spacer insulation layer covering a side surface of the magnetic stack and having an inclined side surface; and forming a free magnetic layer covering an upper surface of the magnetic stack and extending over the inclined side surface of the spacer insulation layer.

At least one other example embodiment provides a method of manufacturing a magnetic memory device. According to at least this example embodiment, the method includes: forming a switching device on a substrate; forming an interlayer insulation layer on the substrate to cover the switching device; and forming a storage node connected to the switching device on the interlayer insulation layer. The storage node may be formed by: forming a magnetic stack on a portion of a substrate, the magnetic stack including a lower magnetic layer; forming a spacer insulation layer covering a side surface of the magnetic stack and having an inclined side surface; and sequentially forming a tunnel barrier layer and a free magnetic layer covering an upper surface of the magnetic stack, and extending over the inclined side surface of the spacer insulation layer.

According to at least some example embodiments, the storage node (MTJ cell) may be formed of a perpendicular or in-plane magnetic anisotropy material and may include a free magnetic layer having a three dimensional structure (e.g., a structure surrounding a lateral surface of a part of a lower layer or a cap structure surrounding the lower layer).

The free magnetic layer of the storage node may include a perpendicular magnetic anisotropy material, and the storage node may have a cell size small enough to embody a cell layout of a $4F^2$ or $6F^2$ structure (F=15 nm or 20 nm).

When the free magnetic layer include an in-plane anisotropy material, the storage node may have a cell size small enough to embody a cell layout of a $4F^2$ (F=10 nm), $6F^2$, or $6F^2$ structure while maintaining an aspect ratio of greater than or equal to about 2.

Thus, a more highly integrated magnetic memory device adopting a design rule of about 20 nm or lower may be embodied using magnetic memory devices according to one or more example embodiments.

Also, when the free magnetic layer includes an in-plane anisotropy material, the aspect ratio of the free magnetic layer may be adjusted by modifying a three dimensional structure so that a more highly integrated non-volatile magnetic memory device may be realized. Further, a refresh cycle of one per day is available or a DRAM may be operated at a refresh rate of higher or lower than one per day. In other words, for example, a DRAM having a refresh rate longer than that required for a typical DRAM may be embodied.

When the free magnetic layer includes a perpendicular anisotropy material, by appropriately selecting a perpendicular magnetic anisotropy material used for the free magnetic layer, a more highly integrated magnetic memory device having the above-described refresh cycle characteristic may be realized.

By using magnetic memory devices according to one or more example embodiments, a magnetic DRAM as a next generation DRAM, which may reduce (e.g., greatly reduce) standby power as compared to existing DRAMs, may be realized.

BRIEF DESCRIPTION OF THE DRAWINGS

Example embodiments will become apparent and more readily appreciated from the following description of the accompanying drawings in which.

DETAILED DESCRIPTION

Figure 1:
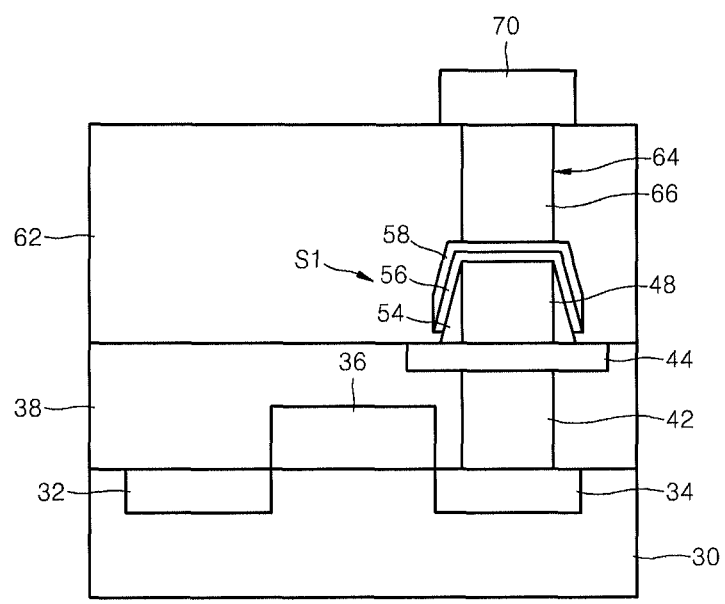
FIG. 1 is a cross-sectional view of a magnetic memory device according to an example embodiment.

Example embodiments will now be described more fully with reference to the accompanying drawings, in which some example embodiments are shown. In the drawings, the thicknesses of layers and regions are exaggerated for clarity. Like reference numerals in the drawings denote like elements.

Detailed illustrative embodiments are disclosed herein. However, specific structural and functional details disclosed herein are merely representative for purposes of describing example embodiments. Example embodiments may be embodied in many alternate forms and should not be construed as limited to only those set forth herein.

It should be understood, however, that there is no intent to limit this disclosure to the particular example embodiments disclosed. On the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of this disclosure. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

A magnetic memory device according to an example embodiment will be described. Also, an example embodiment of a storage node including a free layer of a magnetic anisotropy material will be described.

FIG. 1 is a cross-sectional view of a magnetic memory device according to an example embodiment.

Referring to FIG. 1, first and second impurity regions 32 and 34 are formed separate from one another in a substrate 30. The substrate 30 may be a semiconductor substrate or a substrate doped with impurities. One of the first and second impurity regions 32 and 34 is a source region, whereas the other is a drain region. A gate structure (or deposition) 36, including a gate electrode, is formed on the substrate 30 between the first and second impurity regions 32 and 34. The substrate 30, the first and second impurity regions 32 and 34, and the gate deposition 36 constitute a field effect transistor (hereinafter, referred to as the transistor). The transistor is merely an example type of switching device. Other types of switching devices, for example, a diode, may be provided instead of the transistor.

A conductive plug 42 is formed on the second impurity region 34. The conductive plug 42 is separated from the gate structure 36. A conductive pad layer 44 is formed on the conductive plug 42. In the example embodiment shown in FIG. 1, the diameter of the conductive pad layer 44 is greater than the diameter of the conductive plug 42. In at least some alternative example embodiments, the conductive pad layer 44 may be omitted. An interlayer insulation layer 38 is formed on the substrate 30 to surround the conductive plug 42 and the conductive pad layer 44. The interlayer insulation layer 38 also covers the first and second impurity regions 32 and 34 and the gate structure 36. The interlayer insulation layer 38 may be a general or conventional insulation material used for semiconductor devices.

Still referring to FIG. 1, a storage node S1 is provided on the conductive pad layer 44. The storage node S1 may be a magnetic tunnel junction (MTJ) cell. In at least this example embodiment, the storage node S1 includes a lower magnetic layer 48. According to at least some example embodiments, the lower magnetic layer 48 may be a single layer or a multi-layer structure including a plurality of layers. The lower magnetic layer 48 may also include a seed layer.

Still referring to FIG. 1, the storage node S1 further includes a spacer insulation layer 54 covering side surfaces of the lower magnetic layer 48. The spacer insulation layer 54 may be an oxide protection layer, for example, a silicon oxide or the like. The side surfaces of the spacer insulation layer 54 are inclined relative to an upper surface of, for example, the conductive pad layer 44. The width of the inclined side surfaces increase from the upper surface of the lower magnetic layer 48 toward the lower surface of the lower magnetic layer 48.

The storage node S1 further includes a tunnel barrier 56 and a free magnetic layer 58 (hereinafter, referred to as the free layer) stacked sequentially. The tunnel barrier layer 56 covers an upper surface of the lower magnetic layer 48 and extends downward covering (onto) at least a portion of the inclined side surfaces of the spacer insulation layer 54. The tunnel barrier layer 56 may be, for example, a magnesium-oxide (MgO) or similar film.

The free layer 58 covers an exterior surface (e.g., an entire exterior surface) of the tunnel barrier layer 56. Consequently, although not in direct contact, like the tunnel barrier layer 56, the free layer 58 covers the upper surface of the lower magnetic layer 48, and also extends downward covering (onto) at least a portion of the side surfaces of the spacer insulation layer 54. Unlike the conventional art in which a free layer has a two dimensional flat structure, the free layer 58 shown in FIG. 1 has a three dimensional structure.

The free layer 58 may be a magnetic layer in which the direction of magnetic polarization is switchable (reversible) in response to an external magnetic field or spin polarization current greater than a critical value. In at least this example embodiment, the free layer 58 may be formed of a magnetic anisotropy material, for example, any one of cobalt (Co), nickel (Ni), iron (Fe), an alloy thereof, or the like. The free layer 58 is a magnetic anisotropy material layer, for example, a magnetic layer containing, for example, Co, Ni, or Fe, as a main magnetic component, and also a non-magnetic component. The free layer 58 may be a CoFe layer or an alloy layer containing CoFe, for example, a CoFeB layer.

According to at least some example embodiments, the free layer 58 may be a perpendicular magnetic anisotropy material layer, such as a material layer having interface perpendicular magnetic anisotropy (IPMA). For example, the free layer 58 may be a CoFeB layer. The free layer 58 may be a magnetic layer including an IPMA material component and a non-magnetic component.

Still referring to FIG. 1, an interlayer insulation layer 62 covers the storage node S1. A via hole 64 exposing a portion of the free layer 58 (e.g., an upper surface of the free layer 58) is formed through the interlayer insulation layer 62. A conductive plug 66 fills the via hole 64. A conductive layer 70 in contact with the conductive plug 66 is formed on the interlayer insulation layer 62. The conductive layer 70 may be a bit line.

Figure 2:
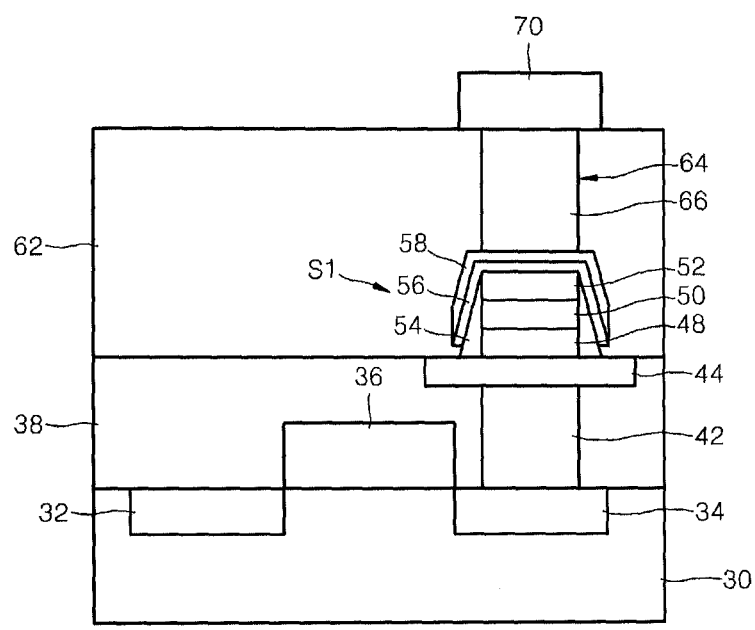
FIG. 2 is a cross-sectional view illustrating a magnetic memory device according to another example embodiment.

FIG. 2 is a cross-sectional view of a magnetic memory device according to another example embodiment.

The magnetic memory device shown in FIG. 2 is similar to the magnetic memory device shown in FIG. 1, except that the storage node S1 in FIG. 2 includes a magnetic stack structure. In this example, when the free layer 58 includes an in-plane magnetic anisotropy material, the storage node S1 includes a magnetic stack structure including: a lower magnetic layer 48, a pinning layer 50 and a pinned layer 52. The lower magnetic layer 48 is similar to the lower magnetic layer 48 shown in FIG. 1, except that the lower magnetic layer 48 has the pinning layer 50 and the pinned layer 52 sequentially deposited thereon. Alternatively, the pinning layer 50 and the pinned layer 52 may be included in the lower magnetic layer 48. The pinning layer 50 may be, for example, an anti-ferromagnetic layer. The pinned layer 52 may be a single layer or a multi-layer structure including plurality of magnetic layers (e.g., a sintered anti-ferromagnetic layer).

In the example embodiment shown in FIG. 2, the spacer insulation layer 54 covers side surfaces of the magnetic stack structure. The tunnel barrier layer 56 covers an upper surface of the pinned layer 52 and extends downward covering (onto) at least a portion of the inclined side surfaces of the spacer insulation layer 54. The tunnel barrier layer 56 may be, for example, a magnesium-oxide (MgO) or similar film. The free layer 58 covers an exterior surface (e.g., an entire exterior surface) of the tunnel barrier layer 56. Consequently, although not in direct contact, like the tunnel barrier layer 56, the free layer 58 covers the upper surface of the pinned layer 52 and also extends downward covering (onto) at least a portion of the side surfaces of the spacer insulation layer 54.

Figure 3:
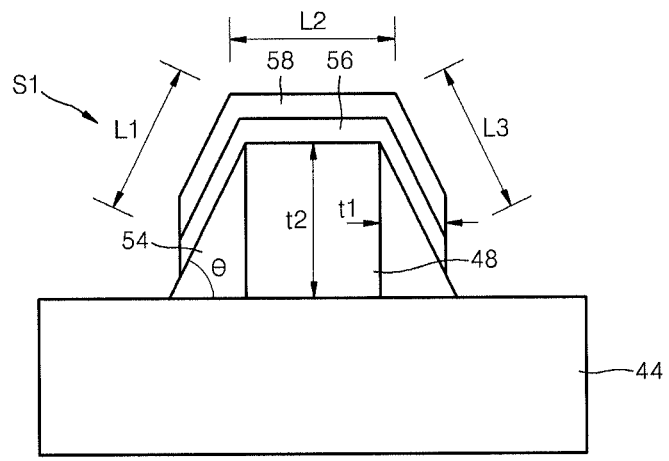
FIG. 3 is an enlarged cross-sectional view of an example embodiment of the storage node shown in FIG. 1.

FIG. 3 is an enlarged cross-sectional view of the storage node S1 of FIG. 1.

Referring to FIG. 3, the maximum angle of an inclination angle θ of the side surfaces of the spacer insulation layer 54 is about 90°. Thus, the inclination angle θ of the side surfaces of the spacer insulation layer 54 may be less than or equal to about 90°. When the free layer 58 is an in-plane magnetic anisotropy material layer, the inclination angle θ may be determined based on or according to a distance t1 between the side surfaces of the lower magnetic layer 48 and the outermost surface of the free layer 58, and an aspect ratio (AR) of the free layer 58. In one example, the distance t1 may be, for example, about 2.5 nm. However, example embodiments are not limited to this example. Rather, the distance t1 may be greater or less than 2.5 nm.

Figure 4:
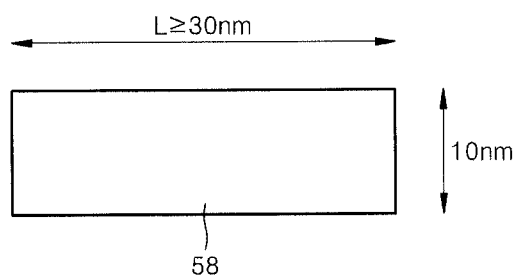
FIG. 4 is a plan view illustrating an example of an aspect ratio (AR) of a free magnetic layer of FIG. 1 when the free magnetic layer is an in-plane magnetic anisotropy material layer.

FIG. 4 is a plan view illustrating an example of an AR of the free layer 58 shown in FIGS. 1 and 3. When the free layer 58 is developed on a plane, as illustrated in FIG. 4, the horizontal length L and the vertical length of the free layer 58 may be greater than or equal to about 30 nm and greater than or equal to about 10 nm, respectively. Thus, the MTJ cell including the free layer 58 may have a size greater than or equal to about 10 nm×30 nm and an AR of greater than or equal to about 2.

Returning to FIG. 3, the inclination angle θ of the side surfaces of the spacer insulation layer 54 may satisfy a condition of the size of an MTJ cell. For example, the inclination angle may be determined such that the size of the free layer 58 is greater than or equal to about 10 nm×30 nm, and the distance t1 is about 2.5 nm.

Figure 5:
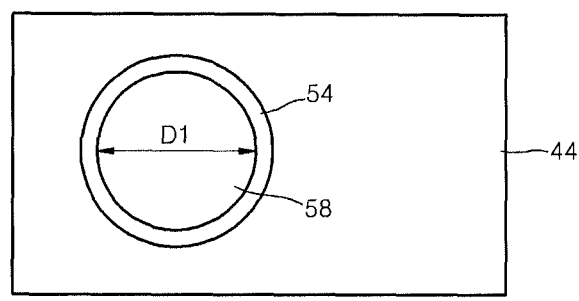
FIG. 5 is a plan view of a free magnetic layer when the free magnetic layer of FIG. 1 is a perpendicular magnetic anisotropy material layer.

When the free layer 58 is a perpendicular magnetic anisotropy material layer, the free layer 58 may have a circular planar shape as illustrated in FIG. 5. The diameter D1 of the free layer 58 may be, for example, about 19 nm when a design rule (D/R) is about 15 nm, and about 26 nm when the D/R is about 20 nm. In at least this example embodiment, the minimum angle of the inclination angle θ may be, for example, greater than or equal to about 70° or greater than or equal to about 75°.

Returning to FIG. 3, the free layer 58 has first, second, and third lengths L1, L2, and L3. According to at least the example embodiment shown in FIG. 3, when the free layer 58 is an in-plane magnetic anisotropy material layer, the sum of the first, second, and third lengths L1, L2, and L3 may be equal or substantially equal to the horizontal length L of the free layer 58 of FIG. 4. The upper surface of the free layer 58 or a portion of the free layer 58 parallel to the upper surface of the lower magnetic layer 48 has the second length L2. The second length L2 may be, for example, about 10 nm. When the size of the MTJ cell is about 10 nm×30 nm and the inclination angle θ is about 90°, the distance t1 may be less than about 2.5 nm. In this case, the second length L2 of the free layer 58 may be greater than or equal to about 10 nm and each of the first and third lengths L1 and L3 of the free layer 58 may be less than about 10 nm.

When the size of the MTJ cell is greater than about 10 nm×30 nm, the horizontal length (L=L1+L2+L3) of the free layer 58 is longer than about 30 nm and the first and third lengths L1 and L3 of the free layer 58 may be greater than or equal to about 10 nm. The first and third lengths L1 and L3 of the free layer 58 may be the same or substantially the same regardless of the size of the MTJ cell. The portion of the free layer 58 having the first and third lengths L1 and L3 is parallel to an inclined surface of the spacer insulation layer 54. As the inclination angle θ increases from the minimum angle, the first and third lengths L1 and L3 of the free layer 58 increases. Also, when the thickness t2 of the lower magnetic layer 48 increases, the length of the inclined surface of the spacer insulation layer 54 increases. Therefore, the first and third lengths L1 and L3 of the free layer 58 may also be increased. Accordingly, because the horizontal length L of the free layer 58 may increase over about 30 nm to satisfy the above conditions, the size of the MTJ cell may be greater than about 10 nm×30 nm (e.g., greater than about 10 nm×40 nm).

When the free layer 58 is a magnetic anisotropy material layer such as CoFeB, the thickness thereof may be about 3 nm, and the size of the MTJ cell may be about 10 nm×40 nm. The KuV of the MTJ cell, where Ku is the effective magnetic anisotropy energy and V is the volume of the free layer 58, may be greater than about 50 $K_B T$, where $K_B$ is a Boltzmann constant and T is an absolute temperature, at a temperature of about 85° C. Accordingly, the MTJ cell satisfies the nonvolatile condition that KuV>50 $K_B T$. When the other conditions of the MTJ cell are the same or substantially the same and the size of the MTJ cell is about 10 nm×30 nm, the MTJ cell may maintain a non-volatile state by being thermally stable for a limited time (e.g., about 24 hours). Accordingly, to maintain the MTJ cell in the same state, a one-time refresh may be needed for a limited time. When the size of the MTJ cell is smaller than about 10 nm×30 nm, the maintenance time in the thermally stable state of the MTJ cell may be shorter than a day (24 hours) and the refresh rate may be shortened.

As such, by adjusting the size of the free layer 58, the magnetic memory device of FIG. 1 may become a non-volatile memory device or a volatile memory device having a refresh rate that is much longer than that of a volatile memory device such as a dynamic random access memory (DRAM). When the magnetic memory device of FIG. 1 is a volatile memory device having a refresh rate that is much longer than that of the volatile memory device such as a DRAM, the magnetic memory device of FIG. 1 is referred to as a magnetic DRAM (MDRAM) so as to be distinguished from a typical volatile memory device such as a DRAM.

When the free layer 58 is a perpendicular magnetic anisotropy material layer, the sum of the first, second, and third lengths L1, L2, and L3 may be equal or substantially equal to the diameter D1 of the free layer 58 of FIG. 5. The upper surface of the free layer 58 or a portion of the free layer 58 parallel to the upper surface of the lower magnetic layer 48 has the second length L2. The second length L2 may be, for example, about 15 nm or 20 nm according to the design rule. When the inclination angle θ is about 90°, the distance t1 may be less than about 1.8 nm or less than about 2.6 nm. In this case, the second length L2 of the free layer 58 may be about 15 nm or 20 nm or more, and each of the first and third lengths L1 and L3 of the free layer 58 may be less than about 7 nm or 10 nm.

The first and third lengths L1 and L3 of the free layer 58 may be the same or substantially the same regardless of the size of the MTJ cell. The portion of the free layer 58 having the first and third lengths L1 and L3 is parallel to an inclined surface of the spacer insulation layer 54. As the inclination angle θ increases from the minimum angle, the first and third lengths L1 and L3 of the free layer 58 increase. Also, when the thickness t2 of the lower magnetic layer 48 increases, the length of the inclined surface of the spacer insulation layer 54 increases. Therefore, the first and third lengths L1 and L3 of the free layer 58 also increase. Accordingly, while the above conditions are satisfied, the size of the free layer 58 may increase within the diameter D.

The product KuV of the volume V of the free layer 58 and the anisotropy energy Ku of the perpendicular magnetic anisotropy material used for the free layer 58 may be greater than about 50 $K_B T$. In this case, the free layer 58 satisfies the nonvolatile condition that KuV>50 $K_B T$.

However, when KuV is less than 50 $K_B T$, the MTJ cell may maintain a non-volatile state by being thermally stable for a limited time (e.g., about 24 hours). Accordingly, to maintain the MTJ cell in the same state, a one-time refresh may be needed for the limited time. The maintenance time of the MTJ cell in the thermally stable state may be shorter than a day (24 hours) and the refresh rate may be shortened, according to the volume of the free layer 58 and the perpendicular magnetic anisotropy material used for the free layer 58.

As such, by properly or appropriately selecting the volume of the free layer 58 and the perpendicular magnetic anisotropy material used for the free layer 58, the magnetic memory device of FIG. 1 may become a non-volatile memory device or a volatile memory device having a refresh rate that is much longer than that of a volatile memory device such as a DRAM.

Figure 6:
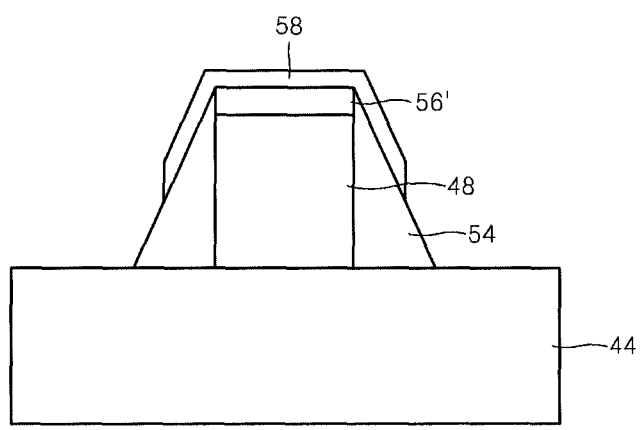
FIG. 6 is a cross-sectional view illustrating an example embodiment of a storage node in which a tunnel barrier is provided on only an upper surface of the lower magnetic layer.

FIG. 6 is an enlarged cross-sectional view of a storage node according to another example embodiment. The storage node shown in FIG. 6 is similar to the storage node S1 shown in FIG. 4, except that the tunnel barrier layer 56' is provided only on the lower magnetic layer 48, and the spacer insulation layer 54 covers side surfaces of the tunnel barrier layer 56' and the lower magnetic layer 48. Other than the differences discussed above, the tunnel barrier layer 56' and the spacer insulation layer 54 are the same or similar to the tunnel barrier layer 56 and the spacer insulation layer 54, respectively, discussed above.

When the tunnel barrier layer 56 has a portion extending over (onto) the side surface of the spacer insulation layer 54, as illustrated in FIGS. 1-3, the tunnel barrier layer 56 is formed to completely cover the edge of the lower magnetic layer 48 (or the edge of the pinned layer 52 when the pinned layer 52 is provided on the lower magnetic layer 48) so that a portion of the tunnel barrier layer 56 corresponding to the edge of the lower magnetic layer 48 is not exposed by etching during a manufacturing process. Accordingly, because a contact state of the lower magnetic layer 48 and the tunnel barrier layer 56 in the storage node S1 of each memory cell is the same or substantially the same, resistance dispersion between the respective memory cells may be more uniform. Such a result may improve reliability of a memory device. Also, when the tunnel barrier layer 56 extends over (onto) the side surface of the spacer insulation layer 54, a contact area between the tunnel barrier layer 56 and a lower layer thereof increases, which may help improve endurance of a memory device.

Figure 7:
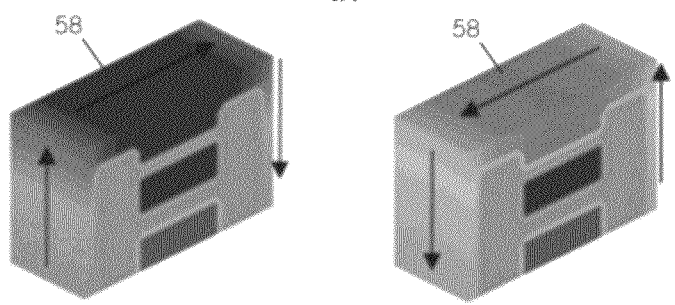
FIG. 7 illustrates switching of a magnetic tunneling junction (MTJ) cell due to an external magnetic field according to an example embodiment.

FIG. 7 illustrates switching of an MTJ cell due to an external magnetic field according to an example embodiment. In FIG. 7, arrows indicate magnetization directions of the free layer 58.

Referring to FIG. 7, the magnetization directions of the free layer 58 are switched normally according to the direction of an external magnetic field. In this example, the magnetization direction is reversed when the intensities of the external magnetic field are about −200 Oe and about 460 Oe.

Figure 8:
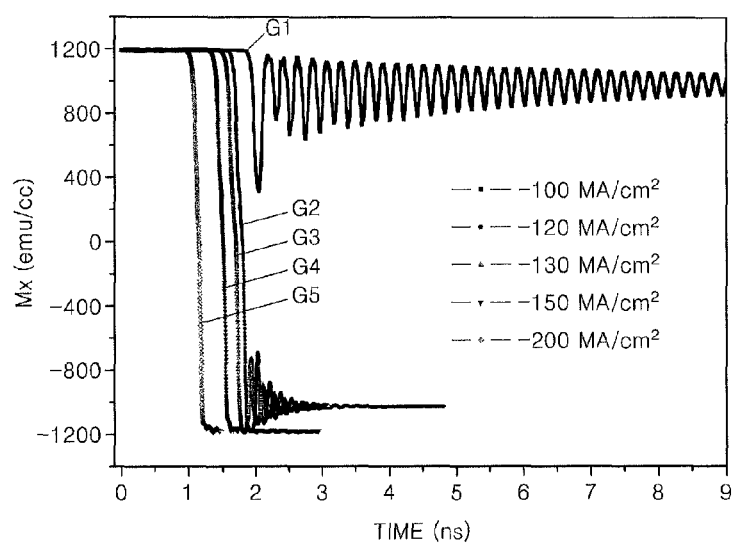
FIGS. 8 and 9 show simulation results for a simulation performed to verify an operation of a storage node (MTJ cell) according to an example embodiment.
Figure 9:
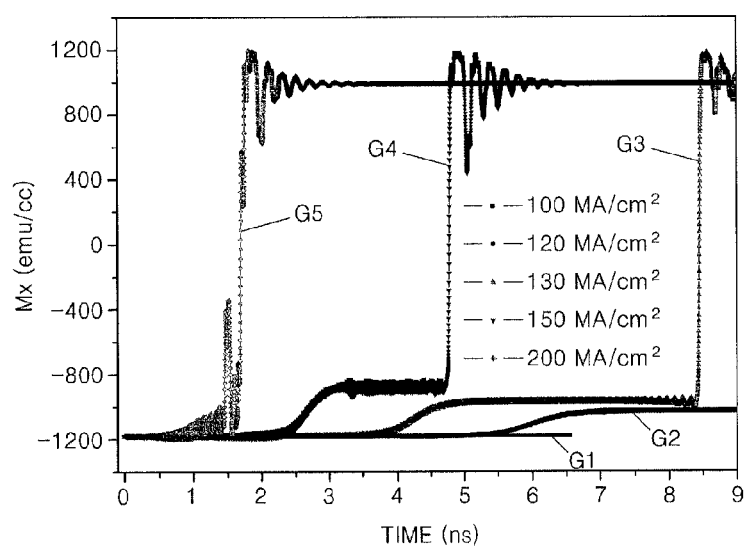

FIGS. 8 and 9 show results of a simulation performed for verifying an operation of an MTJ cell when the free layer 58 of the MTJ cell is an in-plane magnetic anisotropy material layer. In the simulation, the free layer 58 is a CoFeB and the thickness of the free layer 58 is about 3 nm. Also, the spacer insulation layer 54 is $SiO_2$, and the inclination angle θ of the spacer insulation layer 54 is about 90°.

In more detail, FIGS. 8 and 9 are graphs showing example simulation results when the magnetization direction of the free layer 58 is switched by applying a spin polarization current rather than an external magnetic field. In FIGS. 8 and 9, the horizontal axis denotes time during which the spin polarization current is applied and the vertical axis denotes the magnetization intensity of the free layer 58.

In still more detail, FIG. 8 shows example simulation results when a spin polarization current is applied to switch the magnetization direction of the free layer 58 to a direction opposite to the magnetization direction of the pinned layer 52 when the magnetization direction of the free layer 58 is parallel to the magnetization direction of the pinned layer 52. In FIG. 8, first to fifth graphs G1-G5 indicate results when the density of a spin polarization current is 100 $MA/cm^2$, 120 $MA/cm^2$, 130 $MA/cm^2$, 150 $MA/cm^2$, and 200 $MA/cm^2$, respectively. When the density of an applied spin polarization current is greater than or equal to about 120 $MA/cm^2$, the magnetization direction of the free layer 58 is reversed. Also, when the spin polarization current is applied, the magnetization direction of the free layer 58 is reversed within about 2 ns.

FIG. 9 shows simulation results when a spin polarization current is applied to switch the magnetization direction of the free layer 58 to a direction parallel to the magnetization direction of the pinned layer 52 when the magnetization direction of the free layer 58 is opposite to the magnetization direction of the pinned layer 52. In FIG. 9, first to fifth graphs G1-G5 indicate results when the density of a spin polarization current is 100 $MA/cm^2$, 120 $MA/cm^2$, 130 $MA/cm^2$, 150 $MA/cm^2$, and 200 $MA/cm^2$, respectively.

Referring to FIG. 9, as the density of the spin polarization current decreases, the time required to reverse the magnetization direction of the free layer 58 increases.

As shown in FIGS. 7-9, the magnetization direction of the free layer 58 of the MTJ cell according to at least some example embodiments is reversed normally by the external magnetic field or the spin polarization current. Accordingly, the in-plane memory device of FIG. 1 operates normally as a magnetic memory device.

Figure 10:
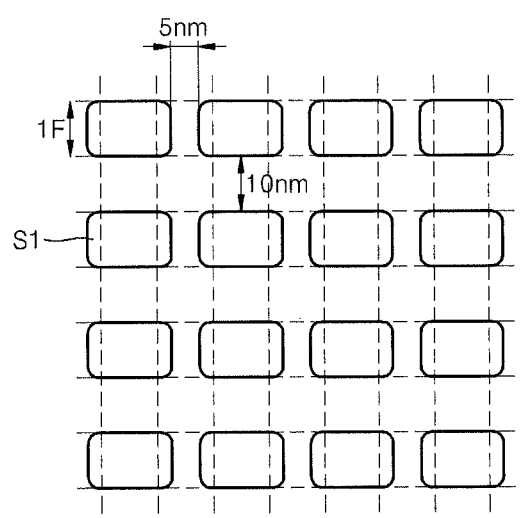
FIG. 10 is a plan view illustrating an array of storage nodes in a cell layout when the free magnetic layer is an in-plane magnetic anisotropy material layer and a transistor of the memory device of FIG. 1 is embodied as a $4F^2$ structure.

FIG. 10 illustrates an example cell layout when a transistor of the memory device of FIG. 1 is embodied as a $4F^2$ structure, and the free layer 58 of the storage node S1 is an in-plane magnetic anisotropy material layer. The D/R of a cell layout is 10 nm and may be the same in the example cell layouts shown in FIGS. 11 and 12.

Figure 11:
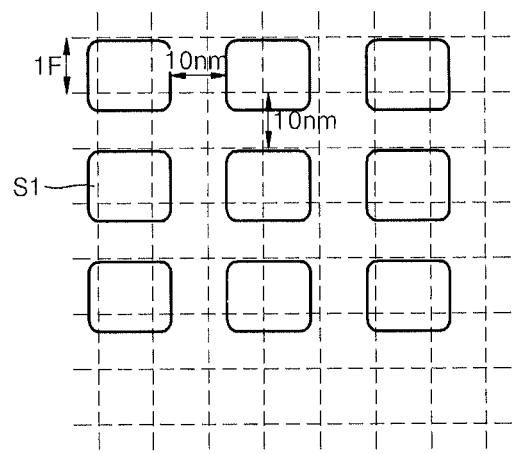
FIG. 11 is a plan view illustrating an array of storage nodes in a cell layout when the free magnetic layer is an in-plane magnetic anisotropy material layer and a transistor of the memory device of FIG. 1 is embodied as a $5F^2$ structure.
Figure 12:
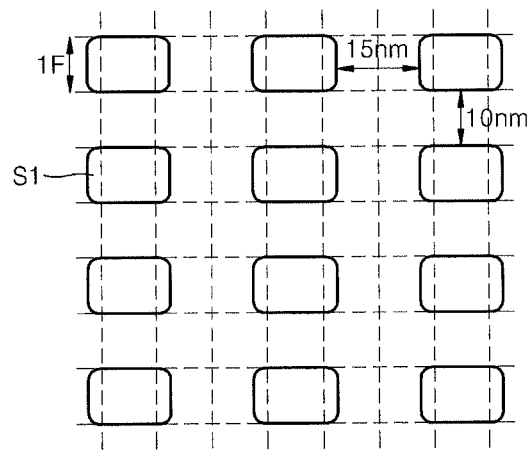
FIG. 12 is a plan view illustrating an array of storage nodes in a cell layout when the free magnetic layer is an in-plane magnetic anisotropy material layer and a transistor of the memory device of FIG. 1 is embodied as a $6F^2$ structure.

In FIG. 10, the size of the storage node S1 is about 10 nm×15 nm and is the same in FIGS. 11 and 12. The horizontal and vertical separation distances of the storage nodes 51 are about 5 nm and about 1F (about 10 nm), respectively.

FIG. 11 illustrates a cell layout when a transistor of the memory device of FIG. 1 is embodied as a $5F^2$ structure, and the free layer 58 of the storage node S1 is an in-plane magnetic anisotropy material layer. In FIG. 11, the horizontal and vertical separation distances of the storage nodes S1 are about 10 nm.

FIG. 12 illustrates a cell layout when a transistor of the memory device of FIG. 1 is embodied as a $6F^2$ structure, and the free layer 58 of the storage node S1 is an in-plane magnetic anisotropy material layer. In FIG. 12, the horizontal and vertical separation distances of the storage nodes S1 are about 15 nm and about 10 nm, respectively. Because the storage node S1 is cubic and cap shaped (e.g., as illustrated in FIG. 3) the storage node S1 may be formed to be as small as a size of about 10 nm×15 nm, in the example cell layouts illustrated in FIGS. 10-12. Thus, a more highly integrated MRAM may be embodied by applying a process of less than or equal to about 20 nm (e.g., a 10 nm design rule process). An MDRAM capable of performing the same or substantially the same function as a DRAM in an area exceeding a current DRAM process limit may also be embodied.

Figure 13:
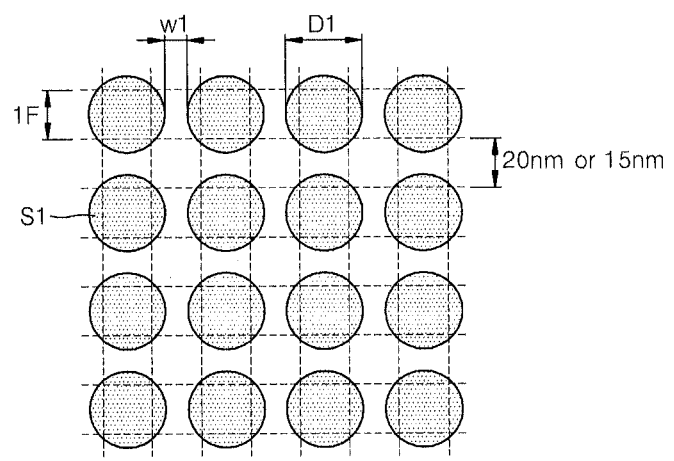
FIG. 13 is a plan view illustrating an example layout of a storage node when the cell size of the memory device of FIG. 1 is $4F^2$.

FIG. 13 is a plan view illustrating an example layout of the memory device of FIG. 1 that is embodied in a $4F^2$ structure when the free layer 58 of the storage node S1 is a perpendicular magnetic anisotropy material layer. In this case, the D/R of the cell layout is about 15 nm or about 20 nm.

In FIG. 13, the diameter D1 of the storage node S1 may be about 19 nm or 26 nm. A horizontal interval w1 between the storage nodes S1 may be about 11 nm (D/R 15 nm, when diameter D1 is about 19 nm) or about 14 nm (D/R 20 nm, when the diameter D1 is about 26 nm) according to the D/R. A vertical interval between the storage nodes S1 may be the same or substantially the same as the horizontal interval. In this example, 1F=15 nm when the D/R is about 15 nm and the diameter D1 is about 19 nm, and 1F=20 nm when the D/R is about 20 nm and the diameter D1 is about 26 nm.

Figure 14:
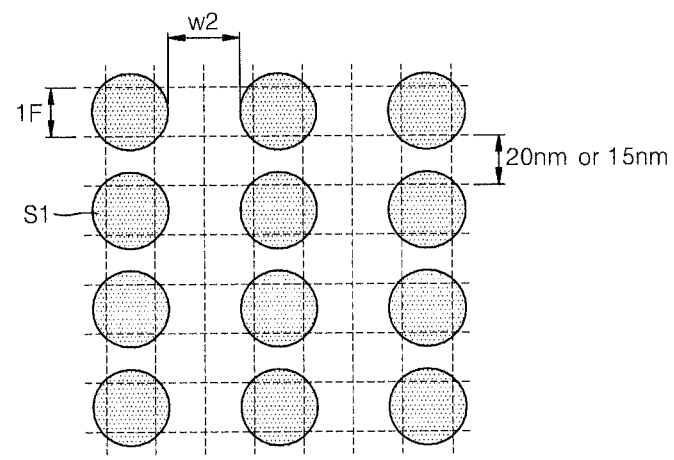
FIG. 14 is a plan view illustrating an example layout of a storage node when the cell size of the memory device of FIG. 1 is $6F^2$.

FIG. 14 is a plan view illustrating an example layout of the memory device of FIG. 1 that is embodied in a $6F^2$ structure when the free layer 58 of the storage node S1 is a perpendicular magnetic anisotropy material layer. In this case, the D/R of the cell layout is about 15 nm or about 20 nm.

In FIG. 14, the diameter of the storage nodes S1 may be about 19 nm when the D/R is about 15 nm, or about 26 nm when the D/R is about 20 nm. A horizontal interval w2 of the storage nodes S1 may be greater than or equal to about 15 nm (D/R 15 nm, when diameter D1 is about 19 nm) or greater than or equal to about 20 nm (D/R 20 nm, when the diameter D1 is about 26 nm) according to the D/R. A vertical interval is about 11 nm when the D/R is about 15 nm and the diameter D1 is about 19 nm. A vertical interval is about 14 nm when the D/R is about 20 nm and the diameter D1 is about 26 nm.

According to at least the example embodiment shown in FIG. 3, the storage node S1 has a three dimensional cap shape. Accordingly, when the D/R is about 15 nm and the diameter D1 is about 19 nm, the diameter of the storage node S1 is about 29 nm. Also, when the D/R is about 20 nm and the diameter D1 is about 26 nm, the diameter of the storage node S1 is about 40 nm.

Thus, a more highly integrated MRAM may be embodied by applying a process in which the D/R is less than or equal to about 20 nm. An MDRAM may be embodied by performing the same or substantially the same function as a DRAM in an area exceeding a current DRAM process limit.

A method of manufacturing a magnetic memory device according to an example embodiment will be described below with reference to FIGS. 15-24. In the following description, like reference numerals are the same as those in the description of the in-plane memory device of FIG. 1, and thus, a description thereof will be omitted herein.

Figure 15:
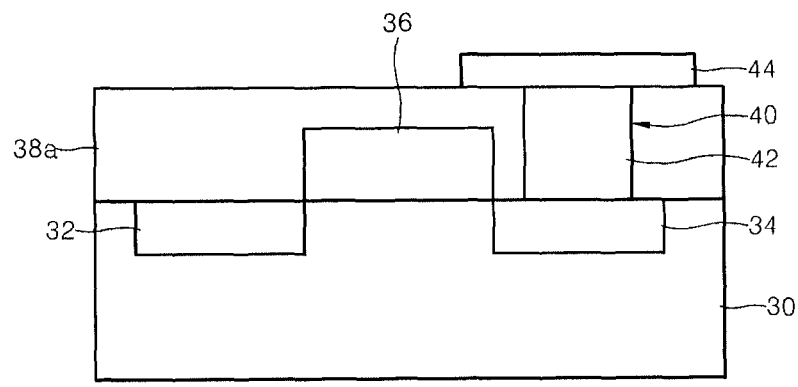
FIGS. 15-24 are cross-sectional views illustrating a method of manufacturing a magnetic memory device according to an example embodiment.

Referring to FIG. 15, a transistor is formed by forming the gate deposition 36 on the substrate 30, and forming the first and second impurity regions 32 and 34 as the source and drain regions in the substrate 30. A first interlayer insulation layer 38a is formed on the substrate 30 to cover the gate deposition 36, and a surface of the first interlayer insulation layer 38a is planarized. A contact hole 40 is formed through the first interlayer insulation layer 38a to expose a portion of the second impurity region 34. The contact hole 40 is filled with the conductive plug 42. The conductive pad layer 44 is formed on the first interlayer insulation layer 38a to cover the conductive plug 42.

Figure 16:
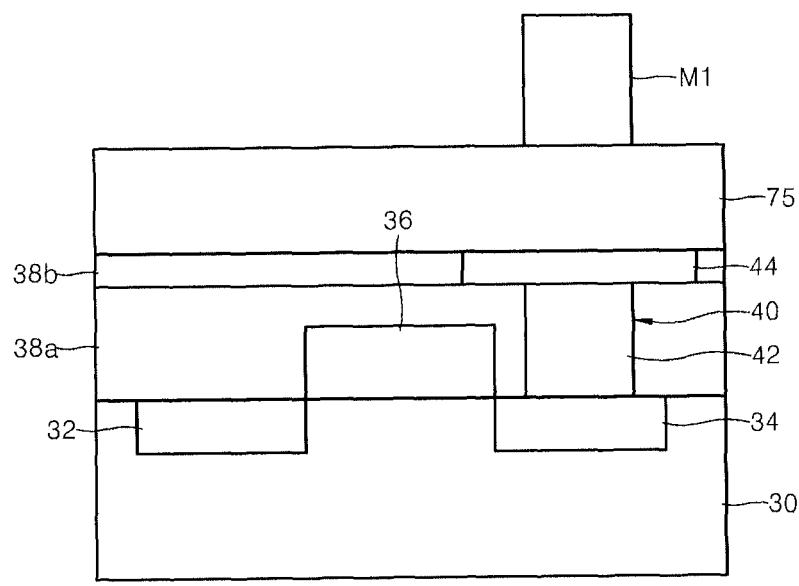

Referring to FIG. 16, a second interlayer insulation layer 38b is formed on the first interlayer insulation layer 38a to cover the conductive pad layer 44. The interlayer insulation layer 38 of FIG. 1 may include first and second interlayer insulation layers 38a and 38b. After the second interlayer insulation layer 38b is formed, an upper surface of the second interlayer insulation layer 38b is planarized until the upper surface of the conductive pad layer 44 is exposed. A magnetic stack 75 is formed on the second interlayer insulation layer 38b to cover the conductive pad layer 44. The magnetic stack 75 may include a seed layer and the lower magnetic layer 48 of FIG. 1. The magnetic stack 75 may further include one or more other material layers, such as the pinning layer 50 and the pinned layer 52 that are sequentially deposited on the lower magnetic layer 48. Alternatively, the magnetic stack 75 may include the lower magnetic layer 48, the pinning layer 50 and the pinned layer 52 stacked sequentially.

A mask M1 is formed on a portion of the surface area of the magnetic stack 75. The mask M1 may be a photoresist pattern located above the conductive plug 42. The mask M1 defines a portion of the magnetic stack 75 to be included in the storage node S1 of FIG. 1. The magnetic stack 75 around the mask M1 is etched until the conductive pad layer 44 is exposed. The mask M1 is removed after the etching is completed.

Figure 17:
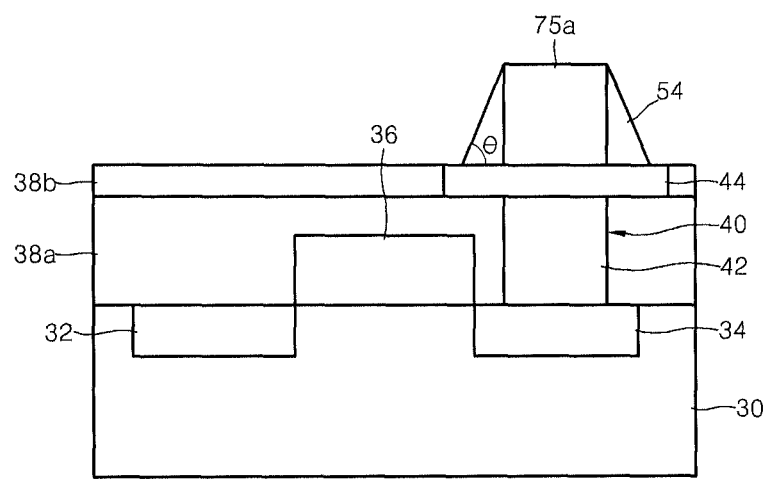

As illustrated in FIG. 17, a magnetic stack pattern 75a is formed on the conductive pad layer 44. The magnetic stack pattern 75a may include the lower magnetic layer 48, the pinning layer 50, and the pinned layer 52 that are stacked sequentially as illustrated in FIG. 2.

According to at least some example embodiments, before the mask M1 is formed, a hard mask (not shown) may be formed on the magnetic stack 75. In this case, the mask M1 may be formed on the hard mask. After the hard mask around the mask M1 is etched, the mask M1 is removed. As a result, the hard mask remains at the same or substantially the same position as the mask M1. The magnetic stack 75 therearound is etched using the remaining hard mask as an etch mask, and then the hard mask is removed. The subsequent process may be the same or substantially the same as that after removing the mask M1.

Referring back to FIG. 17, after forming the magnetic stack pattern 75a, the spacer insulation layer 54 covering the side surfaces of the magnetic stack pattern 75a is formed. The inclined surfaces of the spacer insulation layer 54 may be formed to have a given, desired or predetermined angle θ. The spacer insulation layer 54 may be formed by performing anisotropic etching on an insulation layer (not shown) that is formed on the second interlayer insulation layer 38b to cover the magnetic stack pattern 75a. The insulation layer remains on only the side surfaces of the magnetic stack pattern 75a due to anisotropic etching characteristics. The inclined surfaces of a remaining portion has a given, desired or predetermined angle, like the spacer insulation layer 54. Thus, by controlling the conditions of the anisotropic etching process, the inclination angle θ of the side surface of the spacer insulation layer 54 may be, for example, greater than or equal to about 70°.

Figure 18:
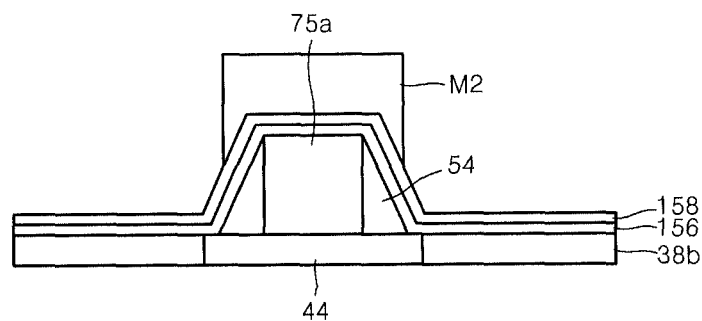

The material layers under the second interlayer insulation layer 38b and the conductive pad layer 44 are omitted from FIG. 18.

Referring to FIG. 18, a tunnel barrier layer 156 and the free layer 158 are sequentially formed on the second insulation layer 38b to cover the magnetic stack pattern 75a and the spacer insulation layer 54. The tunnel barrier layer 156 and the free layer 158 may be formed to have a uniform or substantially uniform thickness on the entire surface where they are formed. The tunnel barrier layer 156 and the free layer 158 may be formed using, for example, a chemical vapor deposition (CVD) method, an atomic layer deposition (ALD) method, a physical vapor deposition (PVD) method, or the like. Other magnetic material layers under the tunnel barrier layer 156 may be formed by using any of the above deposition methods. A mask M2 is formed on the free layer 158. The mask M2 covers a portion of the free layer 158 that covers the upper surface of the magnetic stack pattern 75a and another portion of the free layer 158 that extends over the side surface of the spacer insulation layer 54.

When the free layer 158 is an in-plane magnetic anisotropy material layer, in FIG. 18, the boundary of the mask M2 may be located apart from (e.g., far from or close to) the upper surface of the free layer 158 considering a planar size or an AR of the free layer 58 to be formed, or a distance between the storage nodes in a cell layout. When the free layer 158 is a perpendicular magnetic anisotropy material layer, the boundary of the mask M2 may be located apart from (e.g., far from or close to) the upper surface of the free layer 158 considering the diameter D1 of the free layer 58 to be formed and the interval between the storage nodes in the resultant cell layout.

The mask M2 may be a photoresist film pattern or a hard mask. When the mask M2 is a hard mask, the mask M2 may be a conductive mask (e.g., a TiN mask, a W mask, or a similar mask). When the mask M2 is a hard mask, the mask M2 may be formed by forming a mask forming material on the free layer 158 and then patterning the mask forming material using a photoresist mask.

After the mask M2 is formed, the portions of the free layer 158 and the tunnel barrier layer 156 around the mask M2 are removed. The mask M2 is then removed. When the mask M2 is the conductive hard mask, the mask M2 may not be removed. This example embodiment is discussed with regard to the mask M2 being removed.

Figure 19:
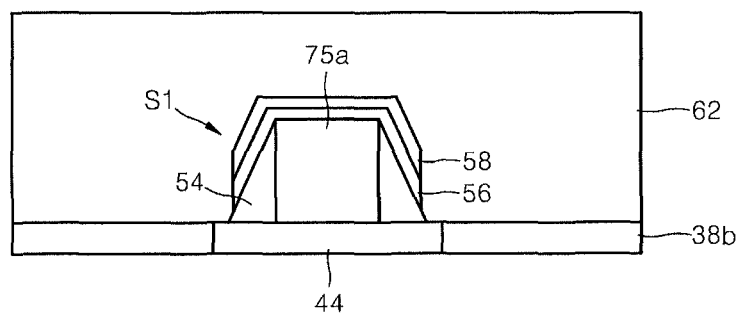

Referring to FIG. 19, after the mask M2 is removed, the tunnel barrier layer 56 and the free layer 58 having a portion extending along the inclined side surfaces of the spacer insulation layer 54 are formed to form the storage node S1.

As shown in FIG. 19, the interlayer insulation layer 62 is formed on the second interlayer insulation layer 38b to cover the storage node S1.

Figure 20:
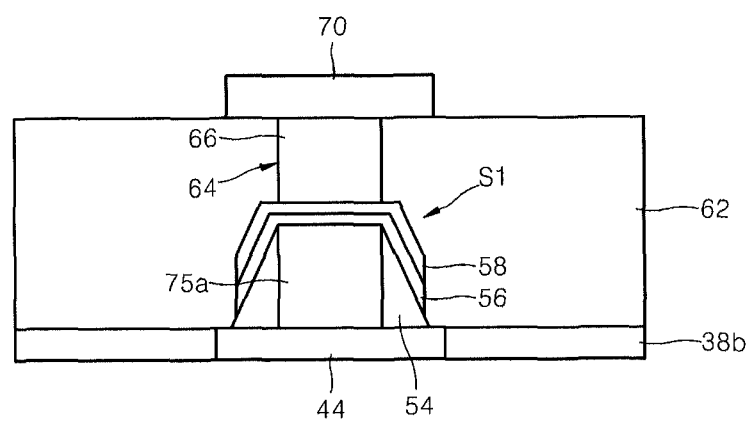

As illustrated in FIG. 20, the via hole 64 is formed through the interlayer insulation layer 62 to expose the upper surface of the free layer 58.

The via hole 64 is filled by the conductive plug 66. A conductive layer 70 is formed on the interlayer insulation layer 62 to contact the conductive plug 66. Thus, a magnetic memory device having the MTJ cell in which the free layer 58 has a three dimensional cap shaped structure is formed.

According to at least some example embodiments, another tunnel barrier layer (not shown) for reinforcing an interface perpendicular magnetization characteristic with respect to the free layer 58 may be formed on the free layer 58. The other tunnel barrier layer may be formed of the same or substantially the same material as the tunnel barrier layer 56 or other oxide.

Figure 21:
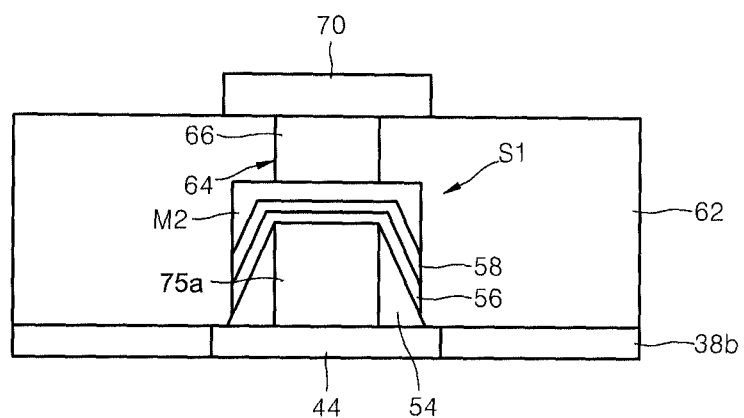

FIG. 21 illustrates an example embodiment in which the via hole 64 and the conductive plug 66 are formed on the mask M2 when the mask M2 of FIG. 18 is a conductive mask, and remains after forming the storage node S1.

An example embodiment of a manufacturing process when only the free layer 58 has a cap structure will be described with reference to FIGS. 22-24.

Figure 22:
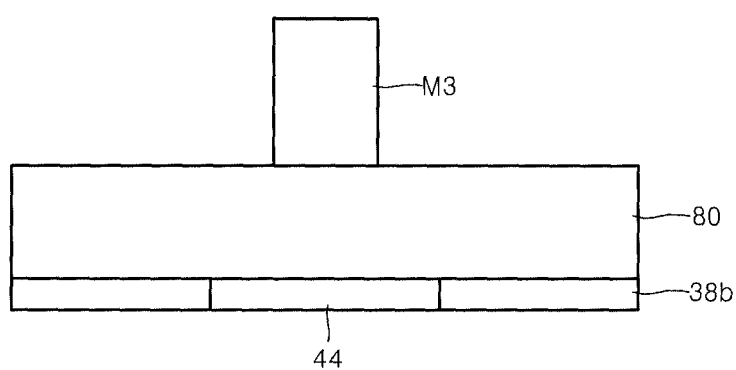

Referring to FIG. 22, a magnetic stack 80 is formed on the second interlayer insulation layer 38b to cover the conductive pad layer 44. The magnetic stack 80 is formed by sequentially depositing, for example, the lower magnetic layer 48 and the tunnel barrier layer 156. The magnetic stack 80 may also include a seed layer. According to at least some alternative example embodiments, the magnetic stack 80 may also include the pinning layer 50 and the pinned layer 52. A mask M3 is formed on the magnetic stack 80. When the magnetic stack 80 around the mask M3 is etched, a magnetic stack pattern 80a is formed as shown in FIG. 23. The mask M3 is then removed.

Figure 23:
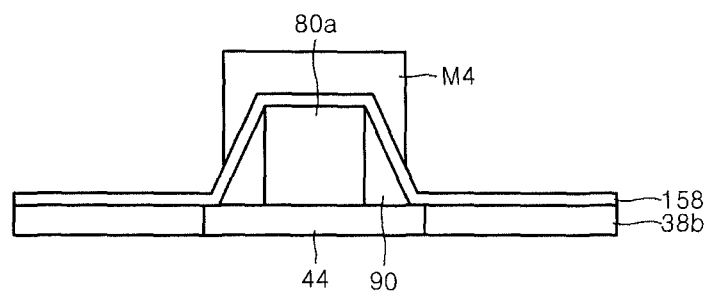

Referring to FIG. 23, a spacer insulation layer 90 is formed on the second interlayer insulation layer 38b to cover side surfaces of the magnetic stack pattern 80a. The spacer insulation layer 90 may be formed in the same or substantially the same conditions and/or methods as those used to form the spacer insulation layer 54 of FIG. 17. The free layer 158 is formed on the second interlayer insulation layer 38b to cover the upper surface of the magnetic stack pattern 80a and the inclined side surfaces of the spacer insulation layer 90. A mask M4 is formed on the free layer 158 to cover the magnetic stack pattern 80a and a portion of the side surfaces of the spacer insulation layer 90. The formation position and material of the mask M4 may be the same or substantially the same as those of the mask M2 of FIG. 18. The portions of the free layer 158 around the mask M4 are etched.

Figure 24:
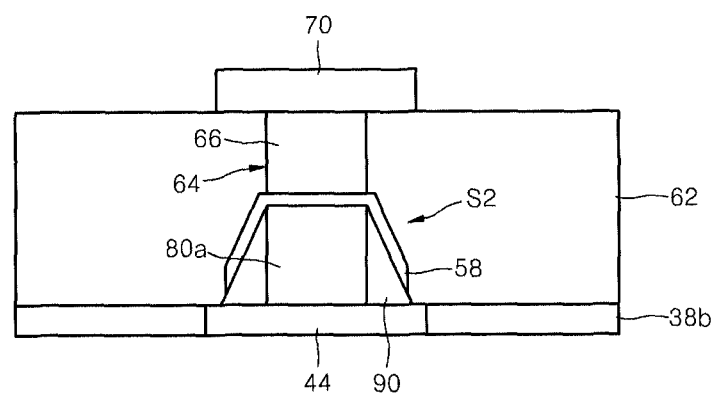

As a result, as illustrated in FIG. 24, the free layer 58 covering the magnetic stack pattern 80a and having a portion extending over (onto) the side surfaces of the spacer insulation layer 90, thereby forming a storage node S2. The mask M4 is then removed. When the mask M4 is a conductive hard mask, the mask M4 may not be removed and may remain. For convenience of explanation, the mask M4 may be removed and the subsequent process may be the same or substantially the same as the processes described with reference to FIG. 20.

Figure 25:
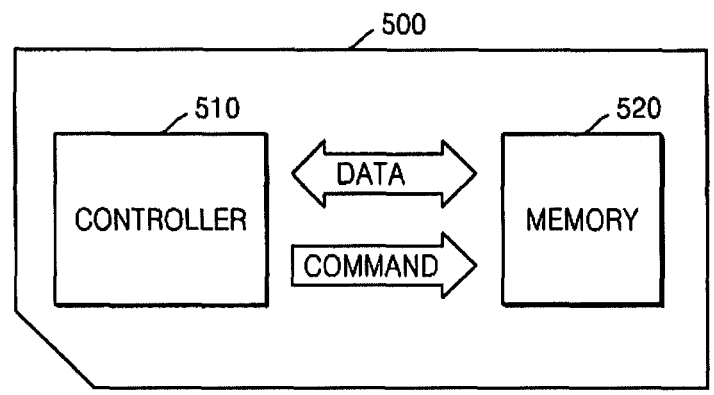
FIG. 25 is a schematic diagram illustrating a memory system according to an example embodiment.

FIG. 25 is a schematic diagram illustrating a memory system (e.g., a memory card) 500 according to an example embodiment.

Referring to FIG. 25, a controller 510 and a memory device 520 are configured to exchange electrical signals. In one example, the memory device 520 and the controller 510 may exchange data according to commands of the controller 510. The memory system 500 may store data in the memory device 520 and/or output data from the memory device 520. The memory device 520 may include one or more magnetic memory devices or components thereof described herein. The memory system 500 may be used as a storage medium for various portable electronic devices. For example, the memory system 500 may be a multimedia card (MMC) or a secure digital (SD) card.

Figure 26:
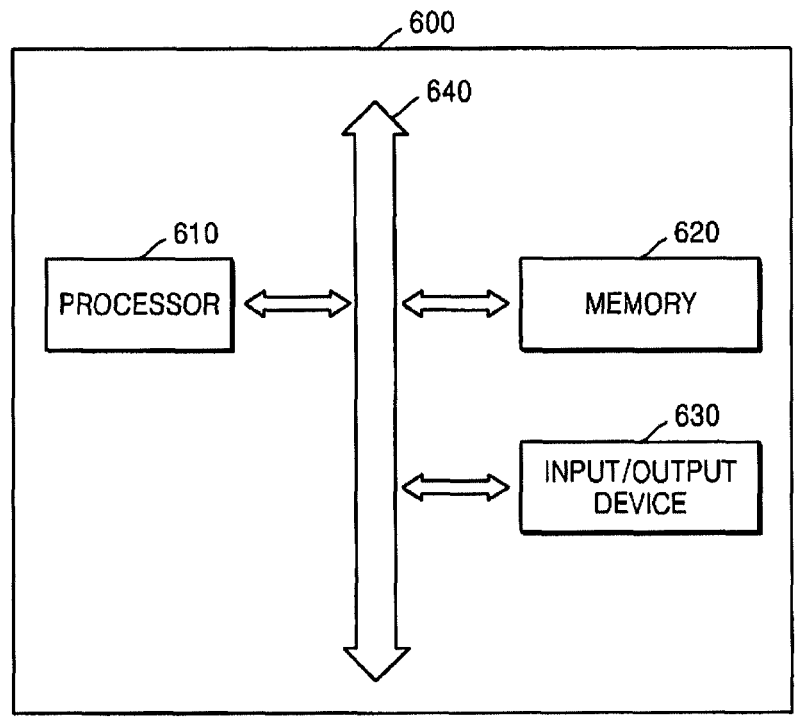
FIG. 26 is a block diagram roughly illustrating an electronic system according to an example embodiment.

FIG. 26 is a block diagram roughly illustrating an electronic system 600 according to an example embodiment.

Referring to FIG. 26, a processor 610, an input/output device 630, and a memory device 620 are configured to perform data communication with each other via a bus 640. The processor 610 may execute programs and/or control the electronic system 600. The input/output device 630 may be used to input/output data to/from the electronic system 600. The electronic system 600 may be connected to an external device, such as a personal computer or a network via the input/output device 630, and may be configured to exchange data with the external device.

The memory device 620 may store codes or programs for operations of the processor 610. For example, the memory 620 may include one or more magnetic memory devices or components thereof described herein.

The electronic system 600 may embody various electronic control systems requiring the memory 620, and, for example, may be used in mobile phones, MP3 players, navigation devices, solid state disks (SSD), or household appliances.

As described above, in magnetic memory devices according to one or more example embodiments, a storage node (MTJ cell) includes a free layer having a three dimensional structure. Accordingly, the storage node may have a relatively small cell size, for example, a cell size small enough to realize a cell layout of $4F^2$ (F=10 nm), $5F^2$, or $6F^2$ while maintaining an AR of greater than or equal to about 2.

By using magnetic memory devices according to one or more example embodiments, a more highly integrated magnetic memory device to which a design rule of less than or equal to about 20 nm is applied may be realized. Also, because the AR of a free layer through the deformation of the three dimensional structure is more controllable, a more highly integrated magnetic memory device may be realized and/or magnetic memory devices according to one or more example embodiments may operate as a DRAM having a refresh rate of once a day, or higher or lower than once a day. That is, for example, a DRAM having a refresh rate longer than that required for a conventional DRAM.

By using magnetic memory devices according to one or more example embodiments, a magnetic DRAM may be realized as a next generation DRAM that may reduce (e.g., substantially reduce) standby power as compared to conventional DRAMs.

It should be understood that the example embodiments described therein should be considered in a descriptive sense only and not for purposes of limitation. Descriptions of features or aspects within each embodiment should typically be considered as available for other similar features or aspects in other example embodiments.

What is claimed is:

1. A storage node of a magnetic memory device, the storage node comprising:
   a lower magnetic layer;
   a tunnel barrier layer formed on the lower magnetic layer, the tunnel barrier layer having an inclined surface surrounding at least a portion of a side surface of the lower magnetic layer; and a free magnetic layer formed on the tunnel barrier layer, the free magnetic layer having a magnetization direction that is switchable in response to a spin current, the free magnetic layer also having a cap structure covering the inclined surface of the tunnel barrier layer.

2. The storage node of claim 1, wherein the tunnel barrier layer has a cap structure surrounding the at least one material layer.

3. The storage node of claim 1, wherein a spacer insulation layer is provided between the free magnetic layer and a side surface of the at least one material layer.

4. The storage node of claim 1, wherein the tunnel barrier layer is provided on only an upper surface of the lower magnetic layer.

5. The storage node of claim 1, wherein the free magnetic layer is an in-plane magnetic anisotropy material layer and surrounds a portion of a side surface of the at least one material layer.

6. The storage node of claim 1, wherein the free magnetic layer is a perpendicular magnetic anisotropy material layer.

7. The storage node of claim 5, wherein the lower magnetic layer comprises:
a pinning layer and a pinned layer that are sequentially stacked on one another, wherein
a distance between side surfaces of the storage node and an outermost surface of the free magnetic layer constitute an aspect ratio,
the aspect ratio of the free magnetic layer is greater than or equal to about 2, and
an area of a cell layout is about 10 nm×15 nm.

8. The storage node of claim 1, wherein when there is no external influence, the free magnetic layer is a non-volatile material layer in which a determined magnetization direction is kept constant.

9. The storage node of claim 1, wherein when there is no external influence, the free magnetic layer is a volatile material layer that requires refresh for each determined cycle to maintain a determined magnetization direction.

10. The storage node of claim 2, further comprising:
a spacer insulation layer between the tunnel barrier layer and a side surface of the at least one material layer.

11. The storage node of claim 3, wherein a side surface of the spacer insulation layer is formed at an inclination angle of between about 70° and about 90°, inclusive.

12. The storage node of claim 9, wherein a refresh rate of the storage node is longer than a refresh rate of a dynamic random access memory (DRAM).

13. A magnetic memory device comprising:
a switching device; and
the storage node of claim 1, the storage node being connected to the switching device.

* * * * *